United States Patent
Pothukuchi et al.

(10) Patent No.: US 11,830,863 B2
(45) Date of Patent: Nov. 28, 2023

(54) DUAL-SIDED CO-PACKAGED OPTICS FOR HIGH BANDWIDTH NETWORKING APPLICATIONS

(71) Applicant: Intel Corporation, Santa Clara, CA (US)

(72) Inventors: Suresh V. Pothukuchi, Chandler, AZ (US); Andrew Alduino, San Jose, CA (US); Ravindranath V. Mahajan, Chandler, AZ (US); Srikant Nekkanty, Chandler, AZ (US); Ling Liao, Fremont, CA (US); Harinadh Potluri, Milpitas, CA (US); David M. Bond, Apex, NC (US); Sushrutha Reddy Gujjula, Chandler, AZ (US); Donald Tiendung Tran, Phoenix, AZ (US); David Hui, Santa Clara, CA (US); Vladimir Tamarkin, Huntingdon Valley, PA (US)

(73) Assignee: Intel Corporation, Santa Clara, CA (US)

( * ) Notice: Subject to any disclaimer, the term of this patent is extended or adjusted under 35 U.S.C. 154(b) by 18 days.

(21) Appl. No.: 17/539,088

(22) Filed: Nov. 30, 2021

(65) Prior Publication Data

US 2022/0085001 A1    Mar. 17, 2022

Related U.S. Application Data

(63) Continuation of application No. 16/809,515, filed on Mar. 4, 2020, now Pat. No. 11,217,573.

(51) Int. Cl.
*H01L 25/16* (2023.01)
*H01L 23/367* (2006.01)
(Continued)

(52) U.S. Cl.
CPC .......... *H01L 25/167* (2013.01); *H01L 23/367* (2013.01); *H01L 23/40* (2013.01);
(Continued)

(58) Field of Classification Search
CPC ..... H01L 25/167; H01L 23/367; H01L 23/40; H01L 23/4006; H01L 23/473;
(Continued)

(56) References Cited

U.S. PATENT DOCUMENTS

| 2012/0113265 A1* | 5/2012 | Galvin | H04N 21/2187 |
| | | | 348/E7.085 |
| 2016/0216445 A1 | 7/2016 | Thacker | |
| 2019/0317287 A1 | 10/2019 | Raghunathan | |

FOREIGN PATENT DOCUMENTS

| EP | 2246945 | 11/2010 |
| JP | 2006059883 | 3/2006 |

OTHER PUBLICATIONS

Office Action from Indian Patent Application No. 202044054575, dated Mar. 7, 2022, 5 pgs.
(Continued)

*Primary Examiner* — Tucker J Wright
(74) *Attorney, Agent, or Firm* — Schwabe, Williamson & Wyatt, P.C.

(57) ABSTRACT

Embodiments disclosed herein include electronic packages for optical to electrical switching. In an embodiment, an electronic package comprises a first package substrate and a second package substrate attached to the first package substrate. In an embodiment, a die is attached to the second package substrate. In an embodiment, a plurality of photonics engines are attached to a first surface and a second surface of the first package substrate. In an embodiment, the
(Continued)

plurality of photonics engines are communicatively coupled to the die through the first package substrate and the second package substrate.

19 Claims, 11 Drawing Sheets

(51) Int. Cl.
  *H01L 23/40* (2006.01)
  *H01L 23/473* (2006.01)
  *H01L 23/538* (2006.01)
  *H04Q 11/00* (2006.01)

(52) U.S. Cl.
  CPC ........ *H01L 23/4006* (2013.01); *H01L 23/473* (2013.01); *H01L 23/5385* (2013.01); *H01L 23/5386* (2013.01); *H04Q 11/0005* (2013.01); *H01L 2023/4031* (2013.01); *H04Q 2011/0039* (2013.01)

(58) Field of Classification Search
  CPC ............. H01L 23/5385; H01L 23/5386; H01L 2023/4031; H04Q 11/0005; H04Q 2011/0039; G02B 6/428; G02B 6/4269; G02B 6/4257; G02B 6/4274
  See application file for complete search history.

(56) References Cited

OTHER PUBLICATIONS

Search Report from European Patent Application No. 20216309.3, dated Jun. 1, 2021, 29 pgs.
Notice of Allowance from Indian Patent Application No. 20216309.3, dated Sep. 13, 2023, 8 pgs.

* cited by examiner

DUAL-SIDED CO-PACKAGED OPTICS FOR HIGH BANDWIDTH NETWORKING APPLICATIONS

CROSS-REFERENCE TO RELATED APPLICATIONS

This application is a continuation of U.S. patent application Ser. No. 16/809,515, filed on Mar. 4, 2020, the entire contents of which is hereby incorporated by reference herein.

TECHNICAL FIELD

Embodiments of the present disclosure relate to electronic packaging, and more particularly to optics packaging for high bandwidth networking applications.

BACKGROUND

As data center traffic continues to scale, it is generally accepted that next generation networks will need tight integration of networking integrated circuits (ICs) (e.g., Ethernet switch silicon dies) and high bandwidth density photonic engines. Currently, the high bandwidth density optics are packaged on the same surface of an interposer that the IC is packaged. Since the area around the perimeter of the IC is limited, future scaling by adding additional photonic engines is limited. Some architectures have proposed implementing additional photonic engines on the system board in order to increase bandwidth. However, such architectures are limited, because the distance between the IC and the photonic engine is increased. As such, there are power penalties due to losses along the interconnect between the IC and the photonic engine.

EMBODIMENTS OF THE PRESENT DISCLOSURE

Described herein are network switching packages for high bandwidth networking applications, in accordance with various embodiments. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

As noted above, future increases in data consumption is necessitating increased bandwidth in switching architectures. Accordingly, embodiments disclosed herein comprise network switching systems with photonic engines packaged to both the top surface and bottom surface of an interposer. Utilizing both surfaces of the interposer for photonic engines, allows bandwidth density scaling to meet future needs. Additionally, since the photonic engines are stacked over each other, the distance of the interconnects from the photonic engines to the switch die is minimized. This reduces losses, and results in improvements to power consumption.

Embodiments disclosed herein are able to stack the photonic engines (i.e., above and below the interposer) by utilizing sockets with increased stand-off heights. That is, the sockets raise the Z-height of the interposer so that there is room below the interposer in order to accommodate the additional photonic engines (and the thermal and mechanical components needed for the additional photonic engines). Additionally, the sockets are arranged so that they are offset from the photonic engines in order to fully utilize the extra space provided by the increased stand-off of the sockets.

Figure 1A:
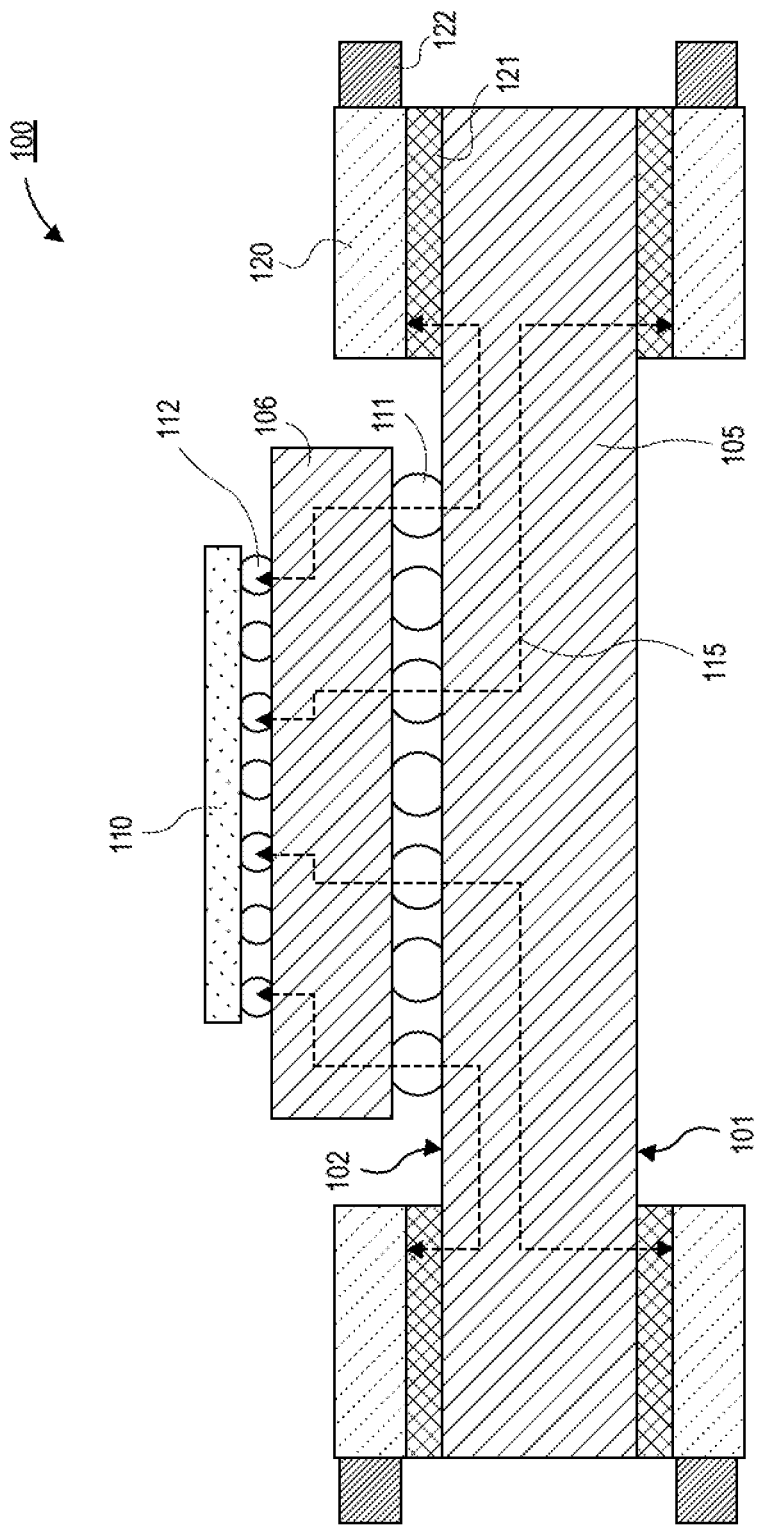
FIG. 1A is a cross-sectional illustration of an electronic package that comprises a switch die and a plurality of photonic engines connected to two surfaces of an interposer, in accordance with an embodiment.

Referring now to FIG. 1A, a cross-sectional illustration of an electronic package 100 is shown, in accordance with an embodiment. The electronic package 100 may comprise a first package substrate 105. The first package substrate 105 may be considered an interposer. The first package substrate 105 may include a plurality of organic layers and conductive routing (not shown for simplicity) embedded in the first package substrate 105. The first package substrate 105 may comprise a first surface 101 (i.e., a bottom surface) and a second surface 102 (i.e., a top surface) opposite from the bottom surface 101.

In an embodiment, a second package substrate 106 may be attached to the first package substrate 105. For example, interconnects 111 may electrically and mechanically couple the second package substrate 106 to the second surface 102 of the first package substrate 105. The interconnects 111 are shown as solder balls, but it is to be appreciated that the interconnects 111 may include any suitable interconnect architecture. In an embodiment, the second package substrate 106 is a high density interconnect (HDI) organic substrate. Conductive features of the second package substrate 106 are omitted for simplicity. In an embodiment, the second package substrate 106 may be a cored substrate, or the second package substrate 106 may be coreless.

In an embodiment, a die 110 may be attached to the second package substrate 106. The die 110 may be electrically and mechanically coupled to the second package substrate 106 by interconnects 112. For example, the interconnects 112 may include solder balls, copper pillars, and the like. In an embodiment, the die 110 is a die suitable for use in switching applications. For example, the die 110 may be a silicon Ethernet switch or the like. In the illustrated embodiment, a single switch die 110 is shown. However, it is to be appreciated that in additional embodiments, two or more switch dies 110 may be included in the electronic package 100.

In an embodiment, a plurality of photonic engines 120 may be attached to the first package substrate 105. As used herein, a "photonic engine" may refer to a device for converting optical signals to electrical signals and/or for converting electrical signals to optical signals. In this way, optical signals received by the electronic package 100 can be converted into an electrical signal for routing by the switch die 110, and subsequently converted back to an optical signal for propagation along an optical cable (e.g., a fiber optic cable). In a particular embodiment, the photonic engines 120 are mechanically and electrically coupled to the first package substrate 105 by a socket 121. The use of a socket 121 for the interconnection has several benefits. One such benefit of using a socket 121 is that the temperature sensitive components (e.g., laser) of the photonic engines are not subjected to the high temperatures needed for reflowing solder interconnects. An additional advantage of using sockets 121 is that replacement of the photonic engine 120 (e.g., in the case of damaged components or in the case of performance upgrades) is simplified. As shown in FIG. 1A, each of the photonic engines 120 may include optical input/outputs 122, such as fiber optic cables, or the like.

In an embodiment, photonic engines 120 are attached to both the first surface 101 and the second surface 102 of the first package substrate 105. The inclusion of photonic engines on the first surface 101 (i.e., opposite from the die 110) allows for the bandwidth of the electronic package 100 to be effectively doubled. For example, where there are eight photonic engines 120 on the second surface 102, there may also be eight photonic engines 120 on the first surface 101.

In an embodiment, the photonics engines 120 may each be communicatively coupled to the die 110 by interconnect paths 115. The interconnect paths 115 are shown as a dashed line for simplicity. However, it is to be appreciated that the interconnect paths 115 represent conductive features (e.g., traces, vias, pads, etc.) of the first package substrate 105 and the second package substrate 106. Whereas adding photonic engines 120 on a system board (as described above) significantly increases the length of the interconnects to the die 110, embodiments where the additional photonic engines 120 are attached to the first surface 101 of the first package substrate 105 provides minimal increases to the length of the interconnect paths 115. As such, losses and power consumption are reduced.

Figure 1B:
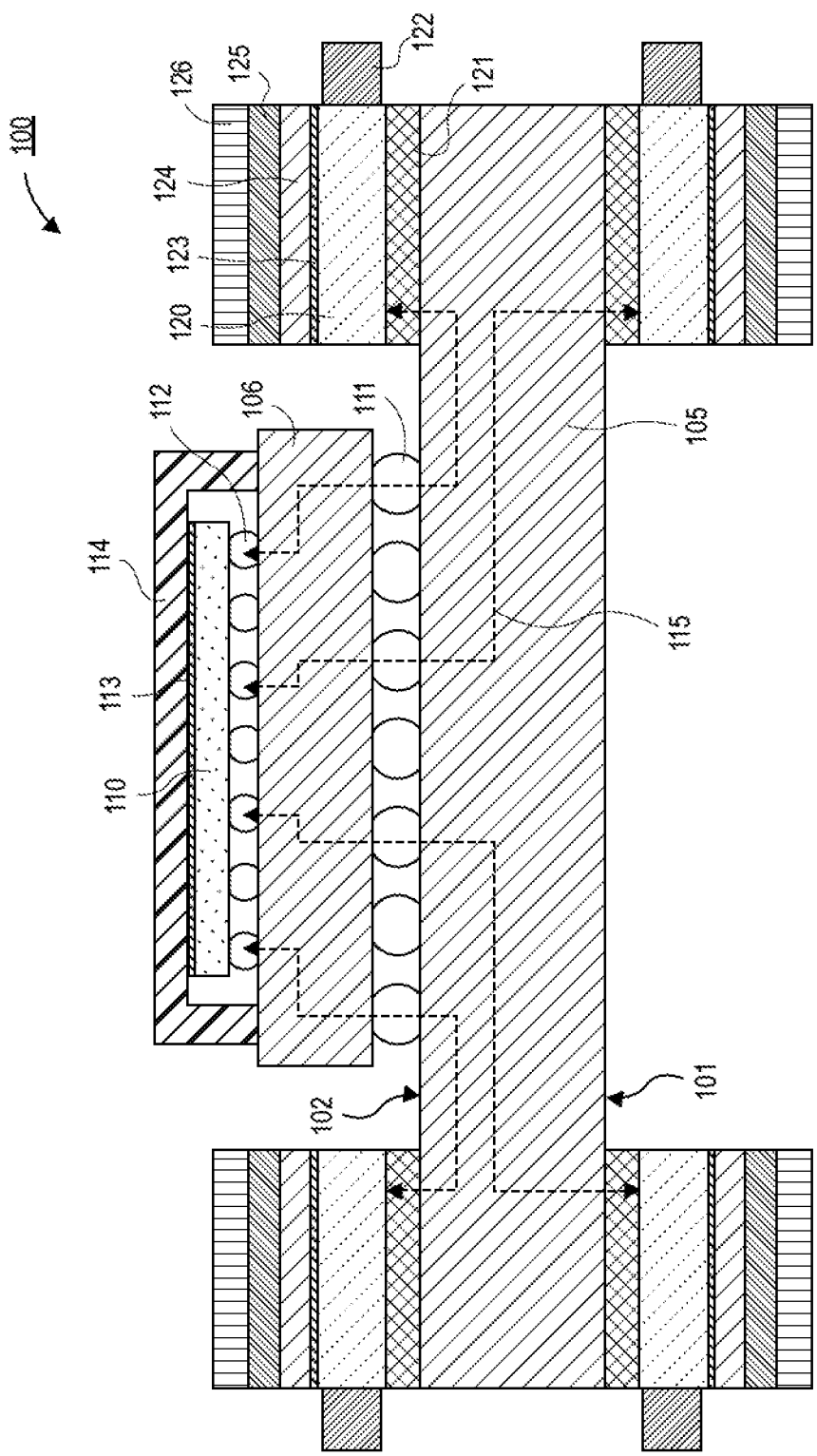
FIG. 1B is a cross-sectional illustration of an electronic package that comprises a switch die, a plurality of photonic engines, and thermal and mechanical components used to cool and secure the electronic package.

Referring now to FIG. 1B, a cross-sectional illustration of an electronic package 100 is shown, in accordance with an additional embodiment. The electronic package 100 in FIG. 1B may be substantially similar to the electronic package 100 in FIG. 1A, with the exception that additional thermal and mechanical components are illustrated. In an embodiment, the die 110 may be thermally coupled to an integrated heat spreader 114 (e.g., a lid) by a thermal interface material 113. The IHS 114 may cover the top surface of the die 110 and have legs that are secured to the second package substrate 106 (e.g., with an epoxy (not shown)). The IHS 114 may be contacted by a heatsink (described in greater detail below).

In an embodiment, each of the photonic engines 120 may be thermally coupled to an IHS 124 by a TIM 123. The IHS 124 may be contacted by a heatsink 125. The heatsink 125 may be any suitable heatsink. For example, the heatsink 125 may be a liquid cooled heatsink. The structure of the heatsinks 125 are described in greater detail below. In an embodiment a retention frame 126 may be disposed over the heatsinks 125. In some embodiments, the retention frame 126 is a ring. That is, the two retention frames 126 over the second surface 102 may be a single structure that is connected out of the plane of FIG. 1B. Similarly, the two retention frames 126 over the first surface 101 may be a single structure that is connected out of the plane of FIG. 1B.

Figure 2A:
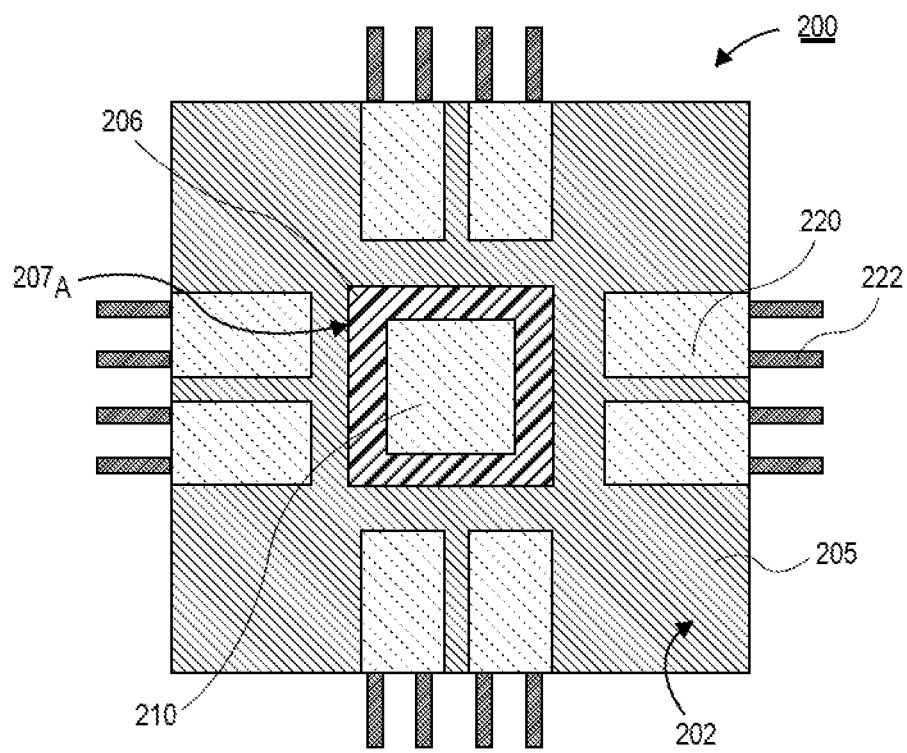
FIG. 2A is a plan view illustration of a top surface of an electronic package that comprises eight photonic engines around a perimeter of the switch die, in accordance with an embodiment.
Figure 2B:
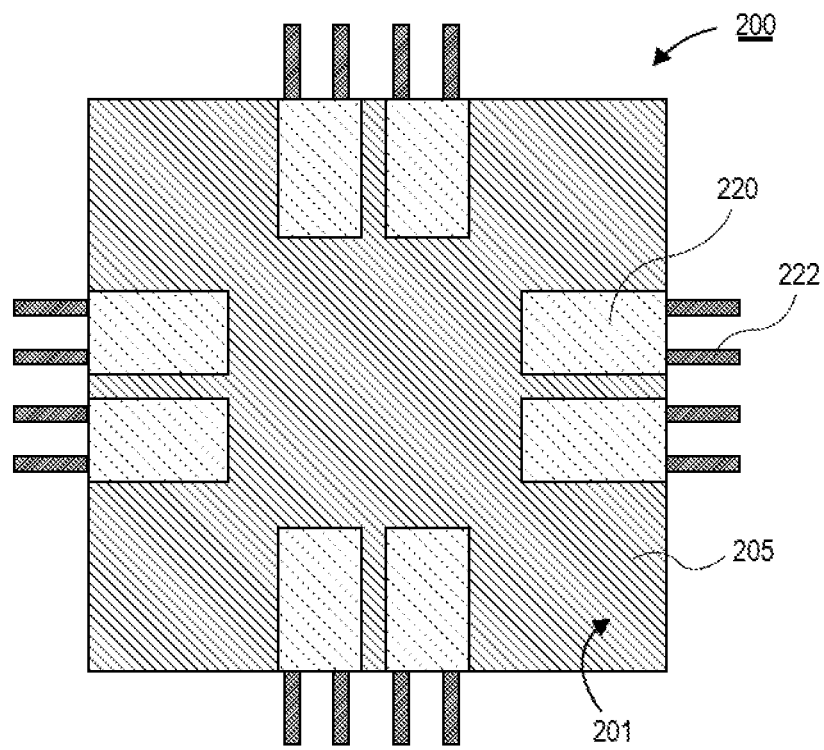
FIG. 2B is a plan view illustration of a bottom surface of an electronic package that comprises eight photonic engines, in accordance with an embodiment.

Referring now to FIGS. 2A and 2B, plan view illustrations of an electronic package 200 are shown, in accordance with an embodiment. FIG. 2A is a plan view illustration of the second surface 202 of the first package substrate 205, and FIG. 2B is a plan view illustration of the first surface 201 of the first package substrate 205. The electronic package 200 in FIG. 2A is shown without the IHSs 114/124, without the heatsinks 125, and without the retention frames 126 in order to not obscure the view of the die 210 and the photonic engines 220.

As shown in FIG. 2A, the die 210 is disposed over the second package substrate 206. The second package substrate 206 is positioned over the second surface 202 of the first package substrate 205. In an embodiment, a plurality of photonic engines 220 are disposed around a perimeter of the die 210 and the perimeter of the second package substrate 206. Optical inputs/outputs 222 may be connected to each photonic engine 220 and extend away from the first package substrate 205. The photonic engines 220 are attached to the first package substrate 205 by sockets (not shown) below the photonic engines 220. In the illustrated embodiment, eight photonic engines 220 are provided over the second surface 202 of the first package substrate 205. For example, a pair of photonic engines 220 are positioned along each edge of the second package substrate 206.

As shown in FIG. 2B, additional photonic engines 220 may be provided on the opposite surface (i.e., the first surface 201) of the first package substrate 205. For example, eight more photonic engines 220 may be attached to the first surface 201 of the first package substrate 205 to provide a total of sixteen photonic engines 220 in the electronic package 200. The photonic engines 220 on the first surface 201 of the first package substrate 205 may each be aligned directly below (i.e., within the footprint of) one of the photonic engines 220 on the second surface 202.

While eight photonic engines 220 are shown in each of FIG. 2A and FIG. 2B (to provide a total of sixteen photonic engines in electronic package 200), it is to be appreciated that any number of photonic engines 220 may be included on the first package substrate 205. For example, in FIG. 2C a total of four photonic engines 220 are provided on the second surface 202 of the first package substrate 205. In the electronic package 200 of FIG. 2B, four more photonic engines 220 may be positioned over the first surface (not shown) to provide a total of eight photonic engines. While examples of four photonic engines 220 per side and eight photonic engines 220 per side are shown, it is to be appreciated that any number of photonic engines 220 may be provided in the electronic package 200.

Figure 2C:
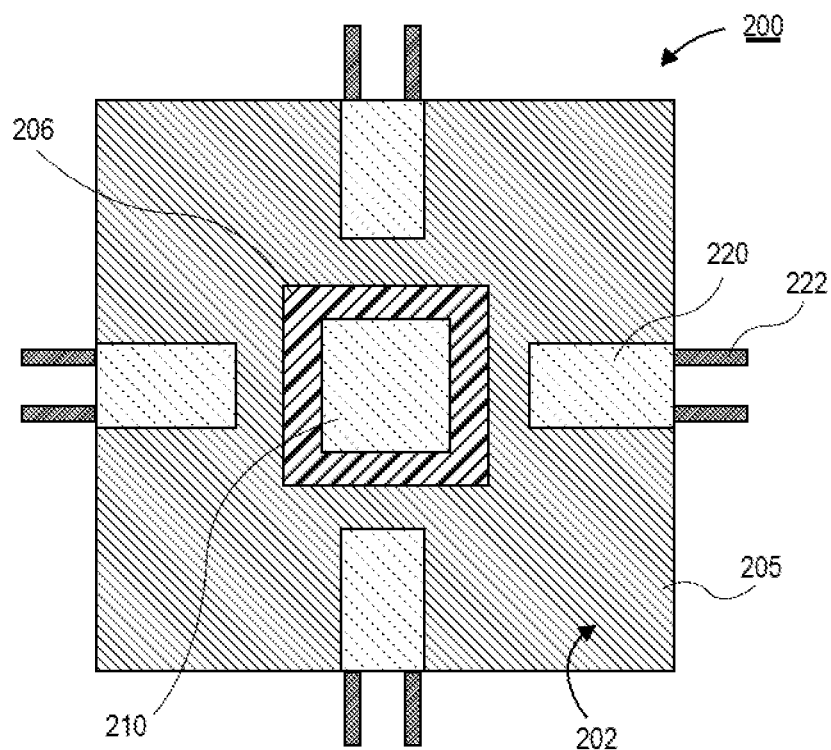
FIG. 2C is a plan view illustration of a top surface of an electronic package that comprises four photonic engines around a perimeter of the switch die, in accordance with an embodiment.

In FIGS. 2A-2C, the number of photonic engines 220 above and below the first package substrate 205 are described as being uniform. However, it is to be appreciated that the number of photonic engines 220 on the first surface 201 of the first package substrate 205 does not need to be equal to the number of photonic engines 220 on the second surface 202 of the first package substrate 205. For example, eight photonic engines 220 may be provided over the second surface 202, and four photonic engines 220 may be provided over the first surface 201.

Figure 2D:
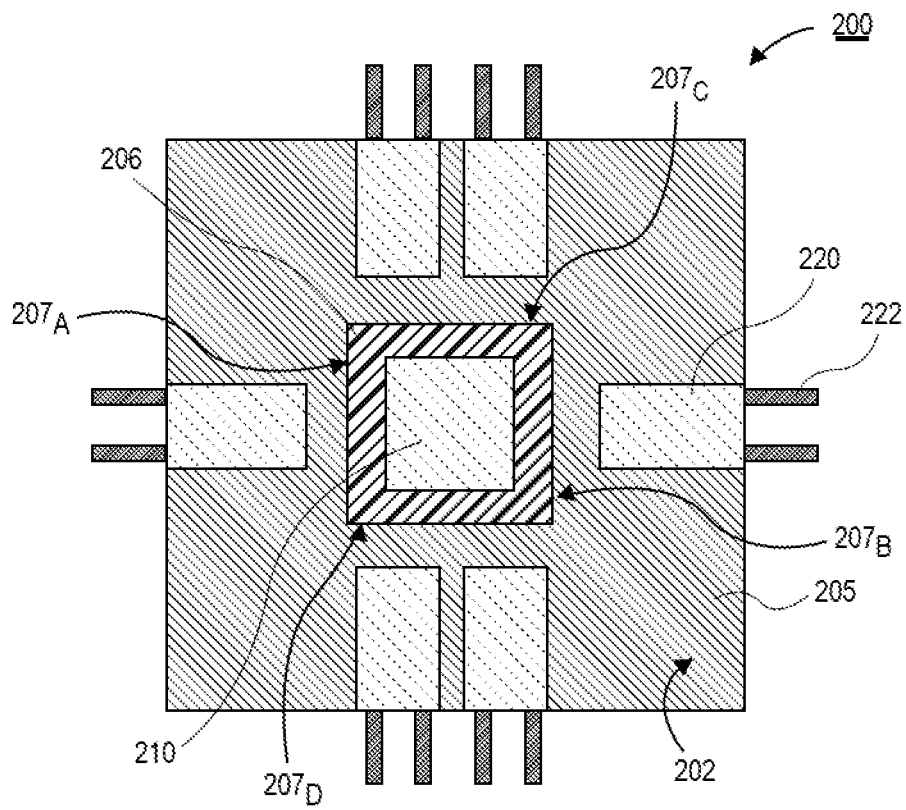
FIG. 2D is a plan view illustration of a top surface of an electronic package that comprises six photonic engines around a perimeter of the switch die, in accordance with an embodiment.

Additionally, while the number of photonic engines 220 along each edge of the second package substrate 206 is shown as being equal, it is to be appreciated that the number of photonic engines 220 along each edge of the second package substrate 206 need not be equal. FIG. 2D provides an example of such a configuration. As shown, a single photonic engine 220 may be disposed adjacent to a first edge 207A and a second edge 207B of the second package substrate 206, and a pair of photonic engines 220 may be disposed adjacent to a third edge 20'7c and a fourth edge 207D of the second package substrate 206.

Figure 3:
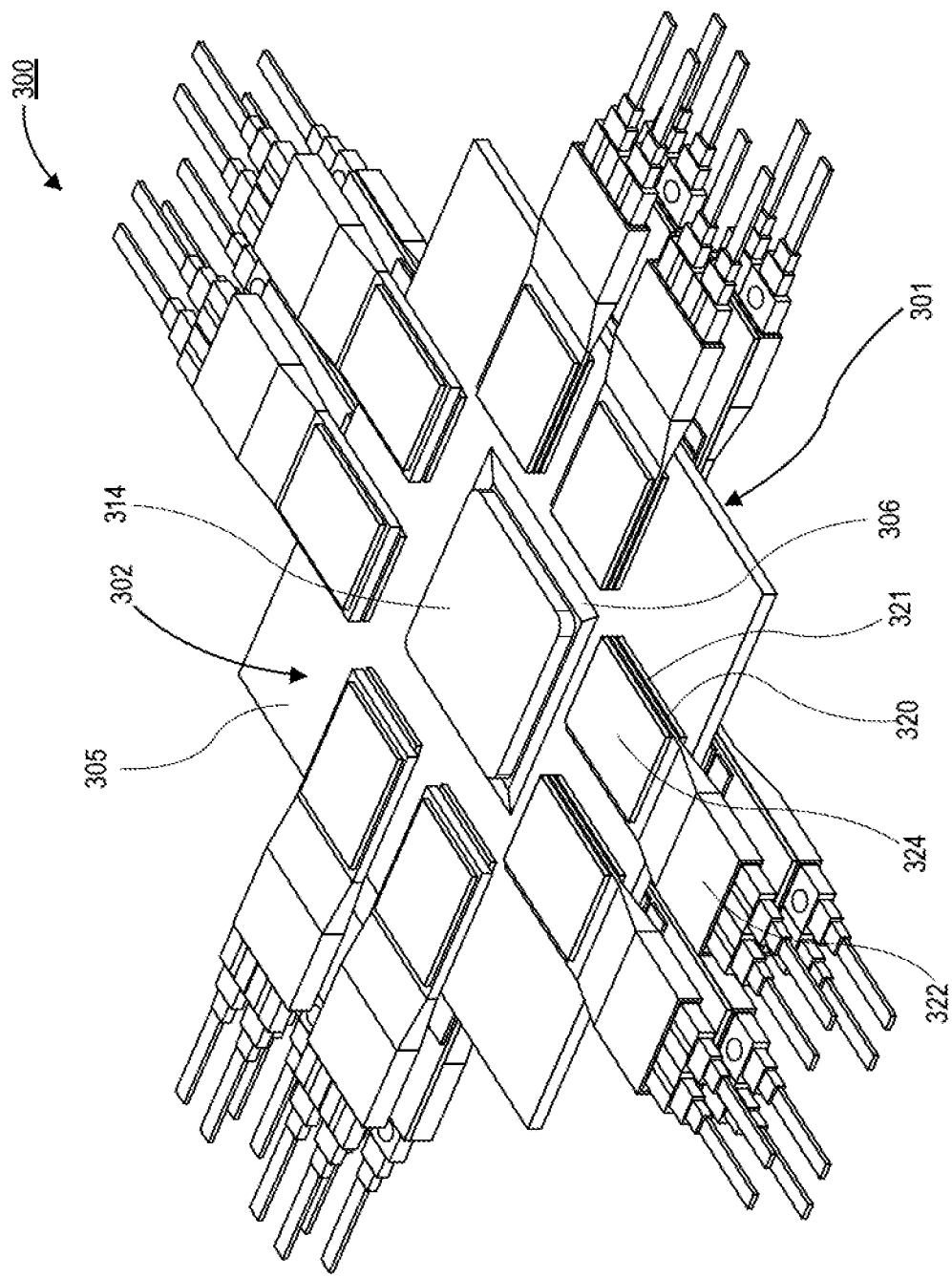
FIG. 3 is a perspective view illustration of an electronic package that depicts the positioning of photonic engines above and below the interposer, in accordance with an embodiment.

Referring now to FIG. 3, a perspective view illustration of an electronic package 300 is shown, in accordance with an embodiment. In the illustrated embodiment, sixteen photonic engines 320 are disposed on a first package substrate 305 (i.e., eight on the first surface 301 and eight on the second surface 302). As shown, each photonic engine 320 on the second surface 302 is stacked directly above one of the photonic engines 320 on the first surface 301. Each photonic engine 320 may include an optical input/output 322 extending away from the first package substrate 305. In an embodiment, each of the photonic engines 320 is attached to the first package substrate 305 by a socket 321.

In an embodiment, an IHS 324 is disposed over each of the photonic engines 320. That is, there are sixteen IHSs 324 in the electronic package 300 shown in FIG. 3. However, in other embodiments there may be fewer IHSs 324 than there are photonic engines 320. For example, a single IHS 324 may span across more than one photonic engine 320. In the illustrated embodiment, the die (not shown) is covered by a die IHS 314. The die IHS 314 may land on the second package substrate 306. In an embodiment, the plurality of photonic engines 320 may surround the second package substrate 306.

Figure 4A:
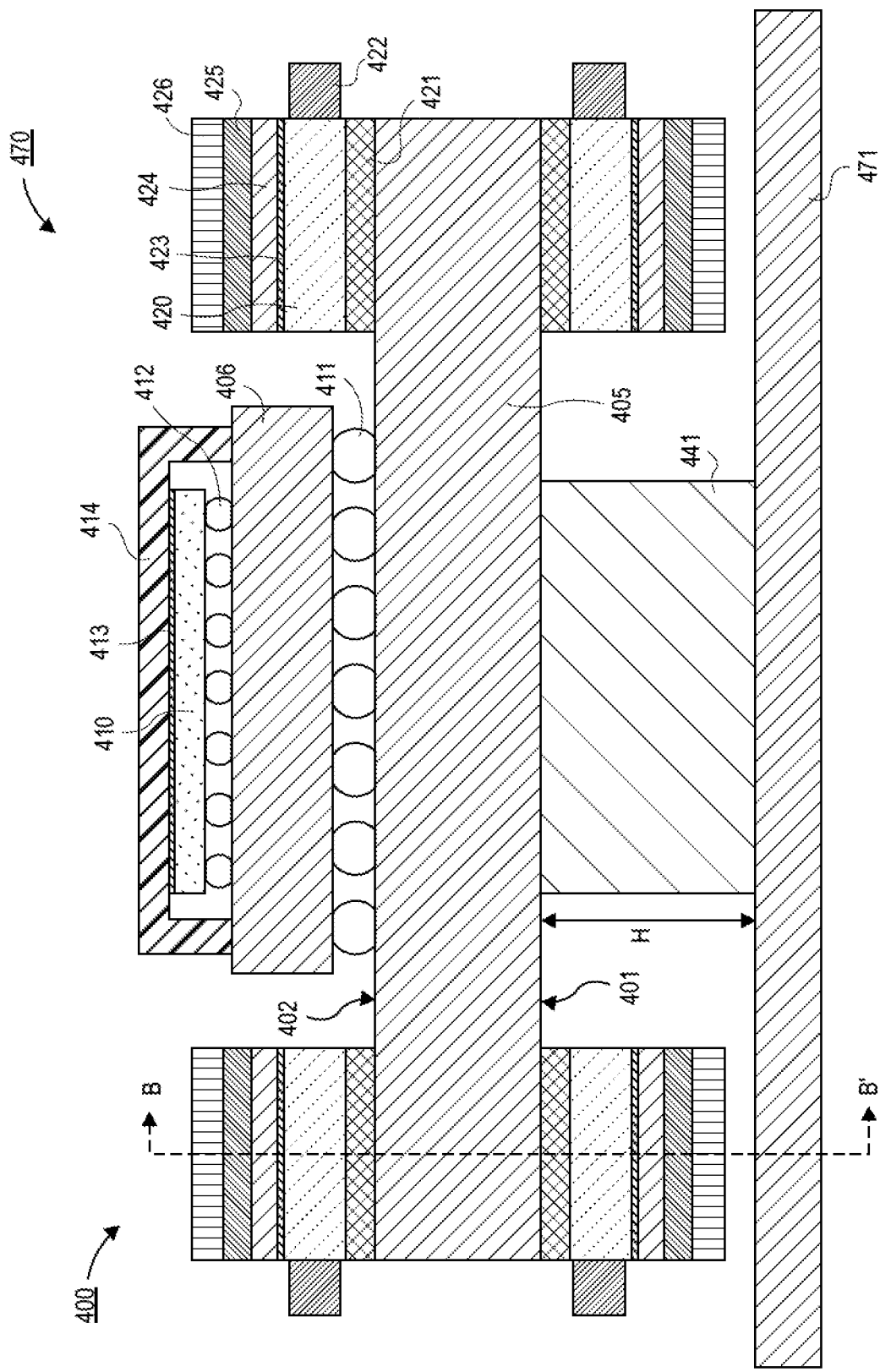
FIG. 4A is a cross-sectional illustration of an electronic system that comprises a switching package with photonic engines on two sides of the interposer with the interposer attached to the board by a socket, in accordance with an embodiment.

Referring now to FIG. 4A, a cross-sectional illustration of an electronic system 470 is shown, in accordance with an embodiment. In some embodiments, the electronic system 470 may be referred to as a switch blade in a modular server system. In an embodiment, the electronic system 470 may comprise an electronic package 400 that is attached to a board 471 (e.g., a system board, motherboard, etc.). The board 471 may include a blade interface (not shown). In an embodiment, the electronic package 400 is attached to the board 471 by a socket 441. As will be described in greater detail below, the socket 441 provides an electrical connection between the electronic package 400 and the board 471 in addition to providing a vertical stand-off height H that allows for photonic engines 420 to be positioned over a first surface 401 of a first package substrate 405 of the electronic package 400.

In an embodiment, the electronic package 400 may be substantially similar to the electronic packages described above. For example, the electronic package 400 may comprise a first package substrate 405 and a second package substrate 406. The second package substrate 406 is attached to a second surface 402 of the first package substrate 405 by interconnects 411. In an embodiment, a die 410 (e.g., a switch die) is attached to the second package substrate 406 by interconnects 412. A TIM 413 may thermally couple the die 410 to an IHS 414.

In an embodiment, the electronic package 400 may comprise a plurality of photonic engines 420. A first set of photonic engines 420 may be disposed over the first surface 401 of the first package substrate 405, and a second set of photonic engines 420 may be disposed over the second surface 402 of the first package substrate 405. The photonic engines 420 may be electrically and mechanically coupled to the first package substrate 405 by sockets 421. Optical inputs/outputs 422 may extend out away from the photonic engines 420. In an embodiment, each photonic engine 420 may be thermally coupled to an IHS 424 by a TIM 423. The IHSs 424 may be in thermal contact with a heatsink 425. In an embodiment, a retention frame 426 may be disposed over each heatsink 425.

Space below the first package substrate 405 to accommodate the first set of photonic engines 420 over the first surface 401 of the first package substrate 405 is provided by the stand-off height H of the socket 441. In an embodiment, the stand-off height H may be approximately 15 mm or greater, approximately 20 mm or greater, or approximately 25 mm or greater. The stand-off height H also provides room for the additional thermal components and mechanical components over the photonic engines 420. As such, the stand-off height H is greater than a maximum thickness of the photonic engines 420.

In an embodiment, the socket 441 is positioned below the die 410. That is, the socket 441 may be within a footprint of the die 410. Positioning the socket 441 directly below the die 410 provides a shorter electrical routing path between the board 471 and the die 410. In some embodiments, the electrical routing through the socket 441 is solely for connections to the die 410. In other embodiments, electrical routing through the socket 441 may also accommodate routing for one or more of the photonic engines 420.

Figure 4B:
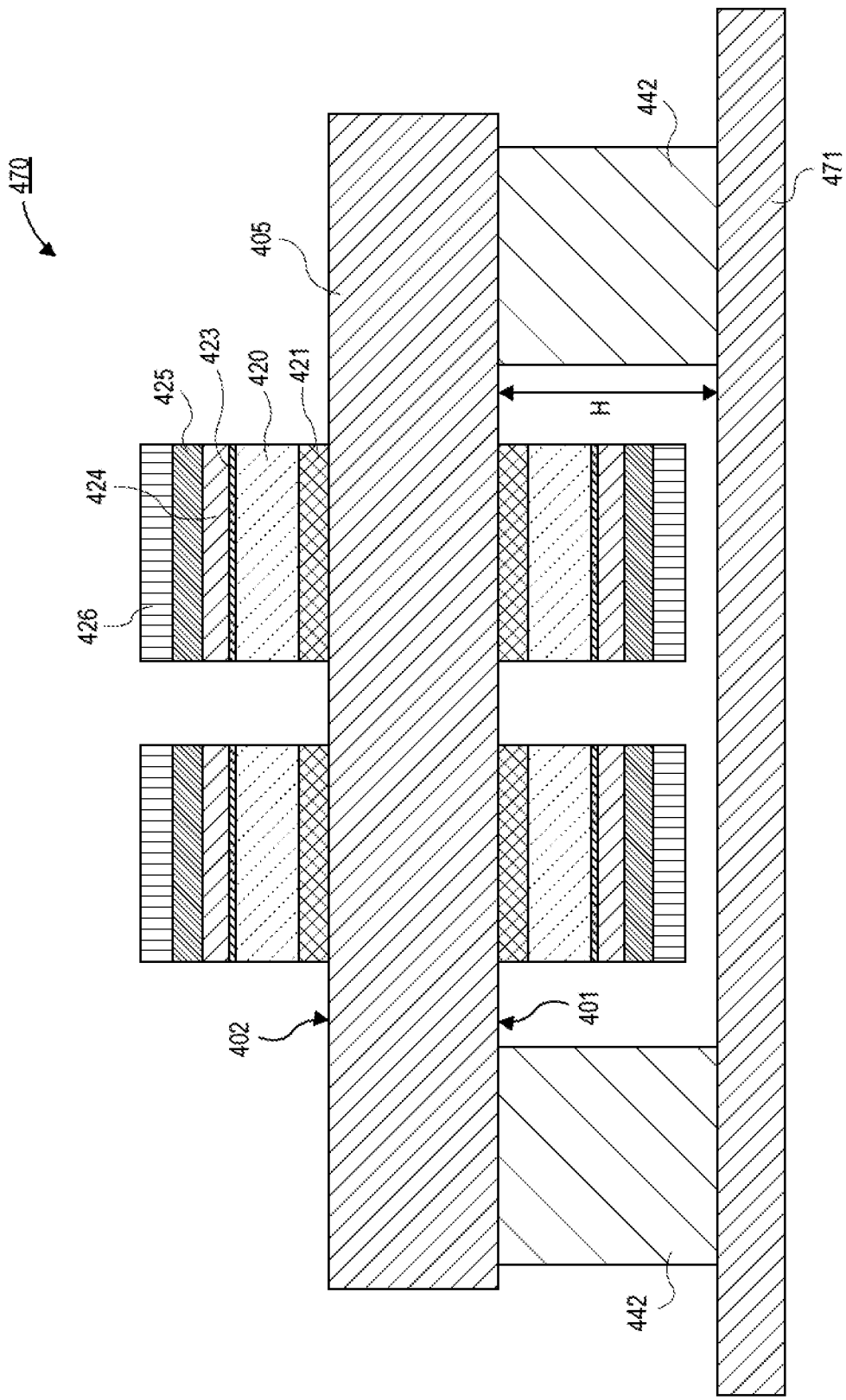
FIG. 4B is a cross-sectional illustration of the electronic system of FIG. 4A along line B-B', in accordance with an embodiment.

Referring now to FIG. 4B, a cross-sectional illustration of the electronic system 470 in FIG. 4A along line B-B' is shown, in accordance with an embodiment. As shown, a plurality of peripheral sockets 442 may also be positioned between the board 471 and the first package substrate 405. In an embodiment, the peripheral sockets 442 may be used to provide electrical routing from the board 471 to one or more of the photonic engines 420. As such, the routing length between the board 471 and the photonic engines 420 is reduced, as compared to if the routing from the board 471 to the photonic engines 420 was routed through the central socket 441 illustrated in FIG. 4A.

In an embodiment, the peripheral sockets 442 may be located at the corners of the first package substrate 405. For example, the peripheral sockets 442 may be offset from the photonic engines 420. That is, in some embodiments, the peripheral sockets 442 are completely outside the footprint of any of the photonic engines 420. As such, the positioning of the peripheral sockets 442 does not disrupt the placement of the photonic engines 420. In an embodiment, the peripheral sockets 442 have the same stand-off height H as the central socket 441.

Figure 5A:
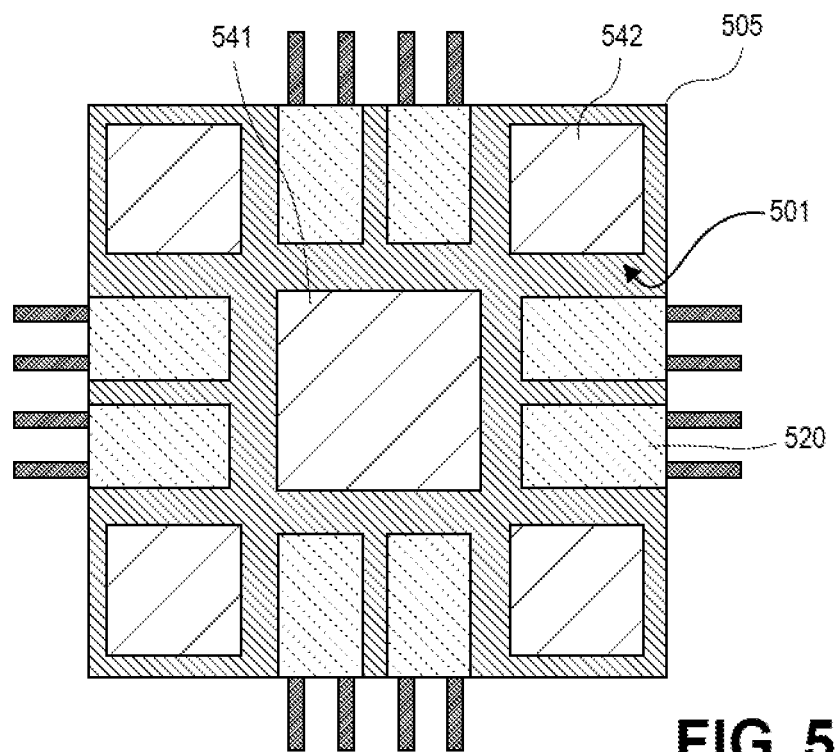
FIG. 5A is a plan view illustrations of the bottom surface of the interposer that shows the layout of sockets and the bottom surface photonic engines, in accordance with an embodiment.

Referring now to FIG. 5A, a plan view illustration of the first surface 501 of the first package substrate 505 is shown, in accordance with an embodiment. As shown, the photonic engines 520 surround a perimeter of the central socket 541. In an embodiment, four peripheral sockets 542 may be positioned at the corners of the first package substrate 505. Each peripheral socket 542 may provide electrical routing for the adjacent photonic engines 520. That is, in some embodiments, each peripheral socket 542 may provide routing for a pair of photonic engines 520 on the first surface 501 of the first package substrate 505 and the overlying pair of photonic engines 520 (not visible in FIG. 5A) on the second surface 502 of the first package substrate 505. In an embodiment, each of the peripheral sockets 542 and the central socket 541 are discrete components.

Figure 5B:
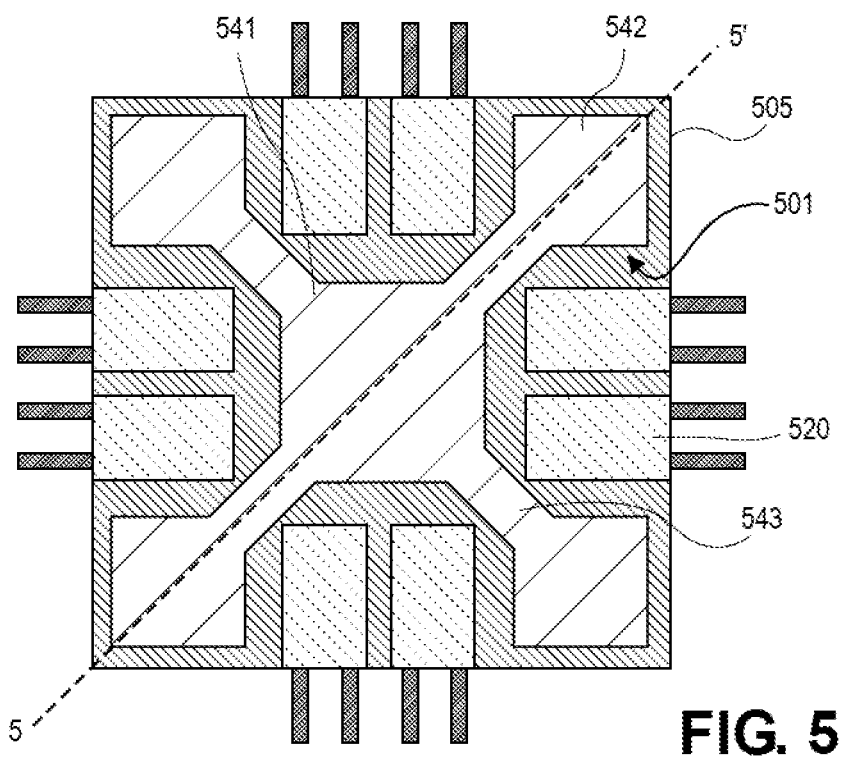
FIG. 5B is a plan view illustration of the bottom surface of the interposer that shows the layout of sockets and the bottom surface photonic engines, where the sockets are connected as a monolithic structure, in accordance with an embodiment.

Referring now to FIG. 5B, a plan view illustration of the first surface 501 of the first package substrate 505 is shown, in accordance with an additional embodiment. As shown, the peripheral sockets 542 and the central socket 541 are formed as a single component. For example, bridges 543 may connect each of the peripheral sockets 542 to the central socket 541. The use of a single component architecture for the sockets 541/542 may provide for improved alignment and simplify assembly. In an embodiment, the bridges 543 may be structural in nature. That is, there may be no electrical routing through the bridges 543. However, in other embodiments, there may be routing in portions of the bridges 543.

Figure 5C:
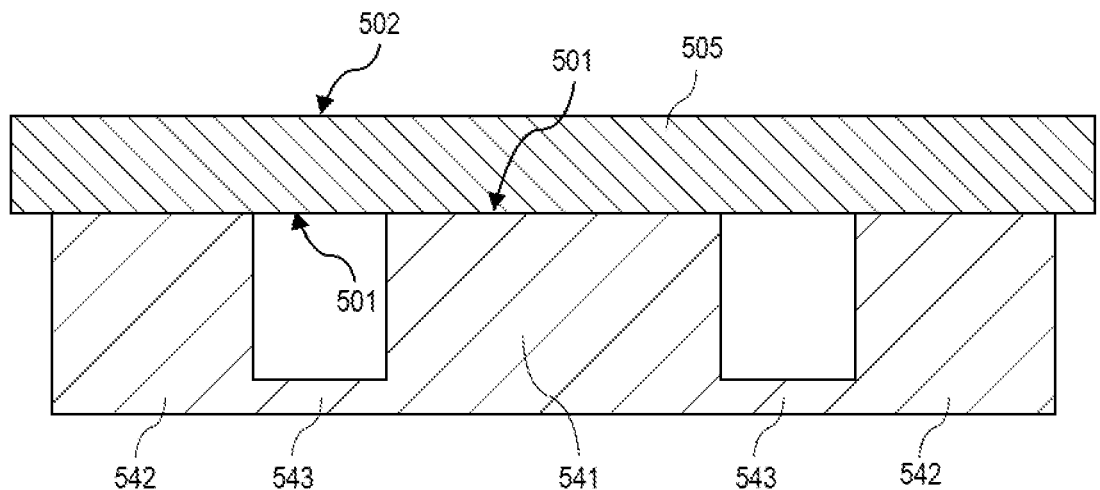
FIG. 5C is a cross-sectional illustration of the interposer in FIG. 5B along line 5-5', in accordance with an embodiment.
Figure 5D:
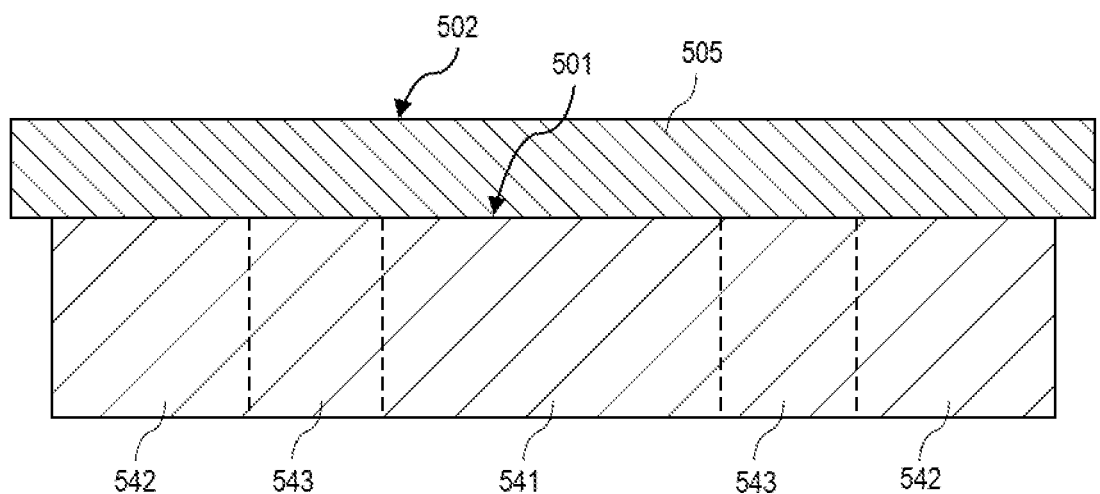
FIG. 5D is a cross-sectional illustration of the interposer in FIG. 5B along line 5-5', in accordance with an additional embodiment.

Referring now to FIG. 5C, a cross-sectional illustration of the first package substrate 505 and the sockets 541/542 along line 5-5' in FIG. 5B is shown, in accordance with an embodiment. As shown, the bridges 543 may have a smaller height than the sockets 541/542. However, in other embodiments the bridges 543 may have substantially the same height as the sockets 541/542. Such an embodiment is shown in the cross-sectional illustration in FIG. 5D.

Figure 6:
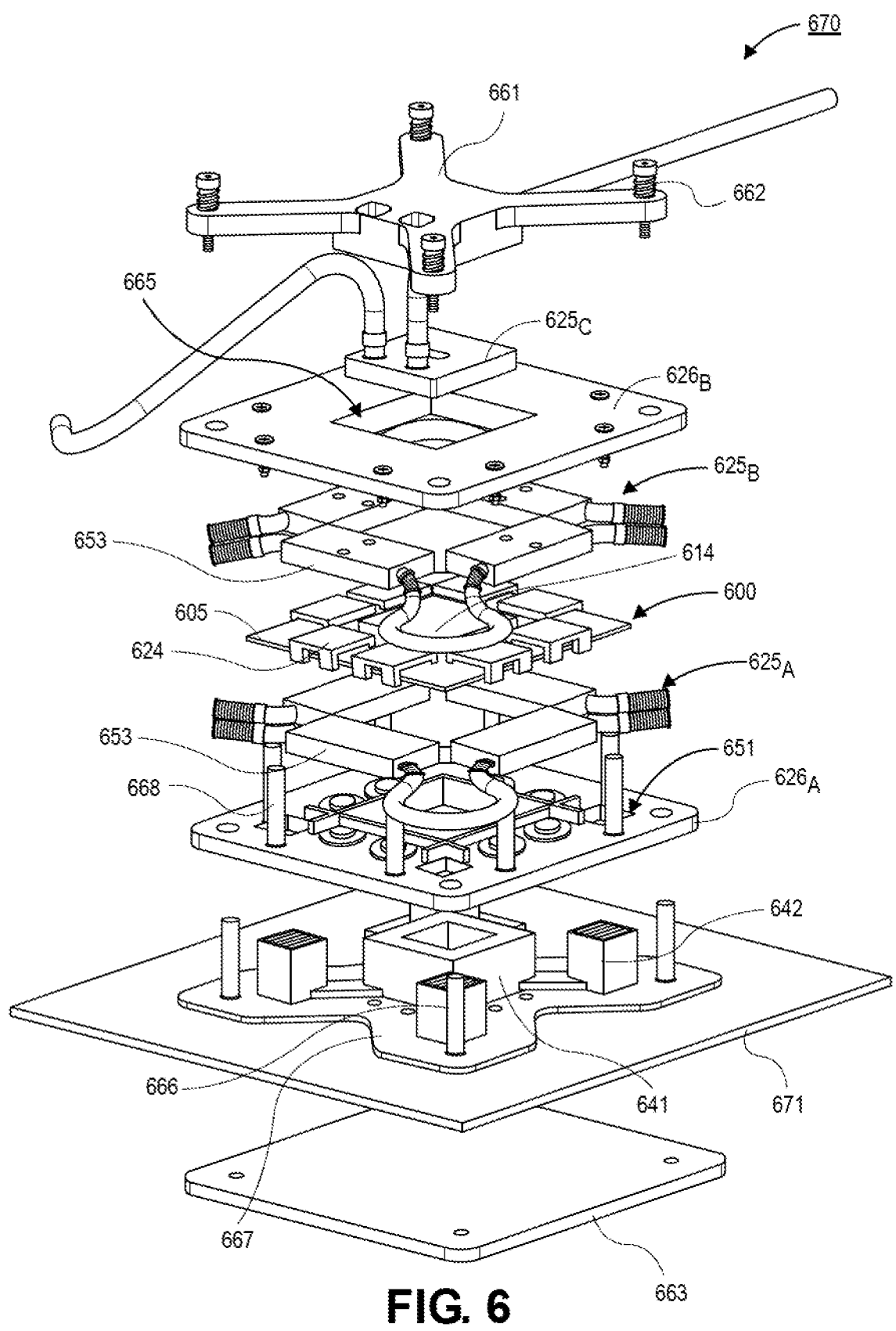
FIG. 6 is an exploded view of an electronic system with photonic engines on two surfaces of the interposer, in accordance with an embodiment.

Referring now to FIG. 6, an exploded view illustration of an electronic system 670 is shown, in accordance with an embodiment. In an embodiment, the electronic system 670 may comprise a board 671. In an embodiment, a central socket 641 and peripheral sockets 642 may be attached to the board 671. In an embodiment, a first retention frame $626_A$ may be disposed over the sockets 641/642. The retention frame $626_A$ may include openings 651 to accommodate the sockets 641/642. As such, the sockets 641/642 may pass through a thickness of the first retention frame $626_A$.

In an embodiment, a first heatsink $625_A$ is disposed over the first retention frame $626_A$. The first heatsink $625_A$ may comprise a plurality of cooling plates 653. In some embodiments, the cooling plates 653 may be liquid cooled plates. In the illustrated embodiments, there are four cooling plates 653, with pairs of the cooling plates 653 being fluidically coupled together. In other embodiments, all of the cooling plates may be fluidically coupled together, or each of the cooling plates may have their own fluid inputs/outputs. The first heatsink $625_A$ may be used to cool the photonic engines (below IHSs 624) provided on a bottom surface of the first package substrate 605.

In an embodiment, an electronic package 600 is disposed over the first heatsink $625_A$. The electronic package 600 may be similar to the electronic packages described above. For example, the electronic package 600 may comprise a first package substrate 605 with a first set of photonic engines over a top surface of the first package substrate 605 and a second set of photonic engines over a bottom surface of the first package substrate 605. In FIG. 6, the photonic engines are hidden by the IHSs 624 positioned over the photonic engines above and below the first package substrate 605. A die (hidden by IHS 614) may be attached to a second package substrate (not visible), with the second package substrate being attached to the top surface of the first package substrate 605. The IHSs 614 are thermally coupled to the first heatsink $625_A$ below the electronic package 600 and a second heatsink $625_B$ above the electronic package 600. In an embodiment, the second heatsink $625_B$ may be substantially similar to the first heatsink $625_A$.

In an embodiment, a second retention frame $626_B$ is positioned over the second heatsink $625_B$. The second retention frame $626_B$ may comprise an opening 665. The opening 665 may be aligned with the die (below IHS 614). The opening allows for a third heatsink $625_C$ to pass through the second retention frame $626_B$ and interface with an IHS 614 over the die. In an embodiment, the third heatsink $625_C$ may also be liquid cooled.

In an embodiment, a loading mechanism 661 may be disposed above the second retention frame $626_B$ and the third heatsink $625_C$. The third heatsink $625_C$ is thermally coupled to the IHS 614. The loading mechanism 661 may include fasteners 662 (e.g., screws) that interface with pins 666 that extend up from a plate 667 attached to the sockets 641/642. The pins 666 may extend through holes in the first retention frame $626_A$ and the second retention frame $626_B$ in order to mechanically secure all of the components of the electronic system 670 together. In some embodiments, alignment pins 668 extending up from the first retention frame $626_A$ may pass through holes in the second retention frame $626_B$ in order to properly align the first retention frame $626_A$ to the second retention frame $626_B$. In some embodiments, a back plate 663 may be disposed on the bottom surface of the board 671. Embodiments that include a back plate 663 may have the pins 666 attached to the back plate 663, and the pins 666 may extend up through the board 671 and through the plate 667.

Figure 7:
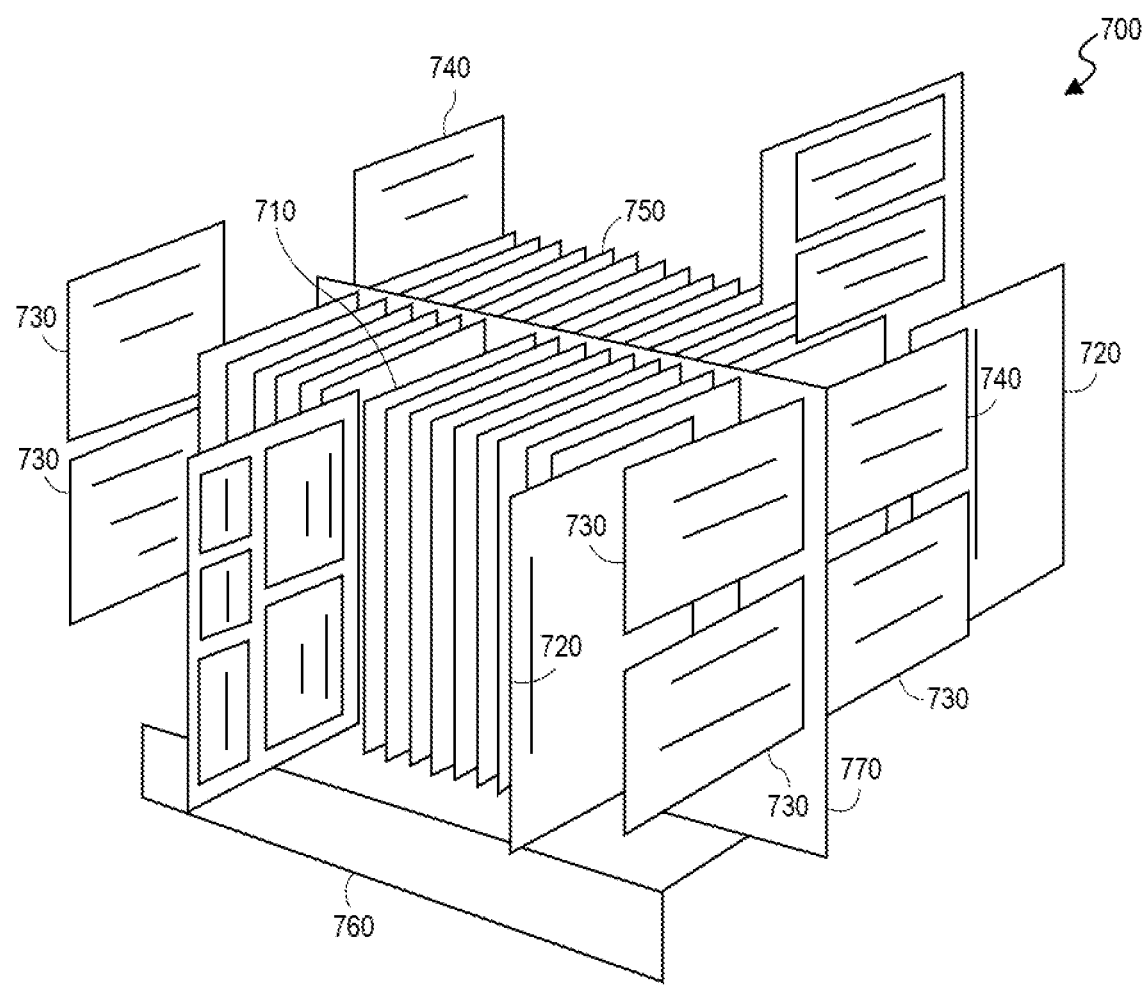
FIG. 7 is a schematic of a computing device built in accordance with an embodiment.

FIG. 7 illustrates a modular server system according to an embodiment of the present invention. In an embodiment, the modular server system 700 is a redundant server system for Web hosting and ASPs requiring server solutions with carrier-class availability, reliability, and scalability. Carrier-class systems have features that are more demanding than enterprise-grade systems, such as "high availability" (HA), high dependability and redundancy. However, it is to be appreciated that embodiments described herein are also applicable to enterprise-grade server systems. In other embodiments, the modular server system 700 may be used for any computing system. For example, the modular server system 700 may be part of a high performance computing systems.

At the heart of the modular server system 700 is the mid plane 770, which may be a PC-style circuit board having a plurality of blade interfaces providing a common interconnect for all modules connected thereto. The blade interfaces are in electrical communication with each other and with the system management bus of the midplane 770. The midplane 770 is preferably based on a CompactPCI form factor (CompactPCI Specification, PICMG 2.0, Version 2.1, by the PCI (Peripheral Component Interconnect) Industrial Computer Manufactures Group (PICMG)), wherein the blade interfaces are CompactPCI slots or connectors. CompactPCI utilizes the Euro card form factor popularized by the "Versa Module Europa" (VME) bus having standard Eurocard dimensions and high density 2 mm pin-and-socket connectors. In the modular server system 700 illustrated in FIG. 7, up to sixteen independent server blades 710 may be supported, along with up to sixteen media blades 750. However, any other numbers of server blades 710 and media blades 750 may be supported. A blade is generally a mother board or a single board computer (SBC) having a central processing unit (CPU). Although it is preferable that each server blade 710 have a corresponding media blade 750, it is not a requirement, as multiple server blades 710 may share a single media blade 750, and vice versa. By utilizing the midplane 770, the network (such as the local area network) becomes the primary interconnect between the blades 710, 750.

The modular server system 700 illustrated in FIG. 7 is also adapted to support any number of switch blades 720 for complete system network (e.g., Ethernet) switching and N+1 redundancy. The switch blades 720 may be optical switch blades for switching optical signals within the modular server system 700 or between different modular server systems (e.g., different racks). In an embodiment, the switch blades 720 may comprise electronic packages, such as those described above that include a plurality of photonic engines positioned on both surfaces of an interposer. The photonic engines may be communicatively coupled to a switch die that is connected to the interposer through a second package substrate. In an embodiment, the electronic package comprising the photonic engines and the switch die are coupled to a board by sockets with a stand-off height of approximately 15 mm or greater, approximately 20 mm or greater, or approximately 25 mm or greater. In an embodiment, the board connects to the midplane 770 using an interface, such as those described above.

In an embodiment, the switch blades 720 have twenty 10/100 Base-T auto-negotiating ports and support 4,096 Media Access Controller (MAC) addresses. Preferably, of the twenty ports, sixteen of them are assigned to one Ethernet channel from the system's 700 mid plane 770 (connected to all sixteen server blades 710, as illustrated in the example in FIG. 7), and the remaining four ports are accessible through RJ-45 (Ethernet) connectors, for example, on the switch blade's 720 face plate. However, other configurations may be adapted depending on the number of server blades 710 supported by the modular server system 700 and depending on whether optical routing is used instead of electrical routing. Data packets are preferably buffered in the switch blade 720 so that Ethernet collisions do not occur on any channel, and a full-managed Layer 3/4 switch may provide Quality of Service (QoS) control, while in all cases a non-block switch fabric with sufficient bandwidth to prevent packet loss is recommended.

In the modular server system 700 illustrated in FIG. 7, a plurality of load sharing power supplies 730 may be connected to the midplane 770 to provide power to the modules of the server system 700. These power supplies 730 (e.g., 150 W power supplies) may provide for N+1 redundancy as well. One or more (AC/DC) inputs 740 may be connected to the midplane 770 to provide input power to the modular server system 700. A removable fan tray with cooling fans 760 may be utilized to provide cooling air flow within the modular server system 700 to cool the modules therein. In other embodiments, a liquid cooling system can be used instead of (or in addition to) the cooling fans 760. The power supplies 730 and the cooling fans 760 of the modular server system 700 may be shared by the server blades 710, the media blades 750, and the switch blades 720 within the modular server system 700 (i.e., each server blade 710, media blade 750, or switch blade 720 need not have its own power supply or cooling fan). The sharing of the power supplies 730 and cooling fans 760 provides a more efficient use of the resources of the modular server system 700 and minimizes space.

The above description of illustrated implementations, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

Example 1: an electronic package, comprising: a first package substrate; a second package substrate attached to the first package substrate; a die attached to the second package substrate; and a plurality of photonics engines attached to a first surface and a second surface of the first package substrate, wherein the plurality of photonics engines are communicatively coupled to the die through the first package substrate and the second package substrate.

Example 2: the electronic package of Example 1, wherein the die is a switch die.

Example 3: the electronic package of Example 1 or Example 2, further comprising: a first socket attached to the first package substrate, wherein the first socket is below the die; and a plurality of second sockets attached to the first package substrate.

Example 4: the electronic package of Example 3, wherein individual ones of the second sockets are offset from individual ones of the photonic engine.

Example 5: the electronic package of Example 4, wherein individual ones of the second sockets are positioned proximate to corners of the first package substrate.

Example 6: the electronic package of Example 3, wherein the first socket and the plurality of second sockets are a monolithic structure.

Example 7: the electronic package of Examples 1-6, wherein a first set of the photonic engines on the first surface of the first package substrate comprises four photonic engines, and wherein a second set of photonic engines on the second surface of the package first substrate a comprises four photonic engines.

Example 8: the electronic package of Examples 1-7, wherein a first set of the photonic engines on the first surface of the first package substrate comprises eight photonic engines, and wherein a second set of photonic engines on the second surface of the package first substrate a comprises eight photonic engines.

Example 9: the electronic package of Example 8, wherein individual ones of the photonic engines in the first set of photonic engines are positioned directly above individual ones of the photonic engines in the second set of photonic engines.

Example 10: the electronic package of Examples 1-9, wherein the individual ones of the plurality of photonic engines are attached to the first package substrate by a socket.

Example 11: the electronic package of Examples 1-10, further comprising: an integrated heat spreader (IHS) attached to individual ones of the photonic engines.

Example 12: the electronic package of Example 11, wherein a single IHS is attached to more than one photonic engine.

Example 13: the electronic package of Example 11, further comprising a plurality of IHSs, wherein individual ones of the plurality of IHSs are attached to a single photonic engine.

Example 14: an electronic package, comprising: a first package substrate with a first surface and a second surface opposite from the first surface; a second package substrate attached to the second surface of first package substrate; a die attached to the second package substrate; first photonic engines attached to the first surface of the package substrate, wherein the first photonic engines are communicatively coupled to the die through the first package substrate and the second package substrate; second photonic engines attached to the second surface of the package substrate, wherein the second photonic engines are communicatively coupled to the die through the first package substrate and the second package substrate; a first socket attached to the first surface of the package substrate, wherein the first socket is within a footprint of the die; and a plurality of second sockets attached to the first surface of the package substrate, wherein individual ones of the second sockets are outside of the footprints of individual ones of the first photonic engines and the second photonic engines.

Example 15: the electronic package of Example 14, further comprising: a plurality of first integrated heat spreaders (IHSs), wherein individual ones of the first IHSs are over individual ones of the first photonic engines; and a plurality of second IHSs, wherein individual ones of the second IHSs are over individual ones of the second photonic engines.

Example 16: the electronic package of Example 15, further comprising: a first heat sink over the first IHSs; a second heat sink over the second IHSs; a first retention frame over the first heat sink; and a second retention frame over the second heat sink.

Example 17: the electronic package of Example 16, wherein the first heat sink and the second heat sink are liquid cooled plates.

Example 18: the electronic package of Example 17, wherein the first retention frame and the second retention frame are rings that retain the first photonic engines and the second photonic engines between them.

Example 19: the electronic package of Example 18, wherein the first socket and the plurality of second sockets extend through the first retention frame.

Example 20: the electronic package of Examples 14-19, further comprising: an integrated heat spreader (IHS) over the die; and a heat sink over the IHS.

Example 21: the electronic package of Examples 14-20, wherein individual ones of the first photonic engines and individual ones of the second photonic engines are attached to the first package substrate by third sockets.

Example 22: an electronic system, comprising: a board; a first package substrate attached to the board by a first socket and a plurality of second sockets, the first package substrate having a first surface facing the board and a second surface facing away from the board; first photonic engines attached to the first surface of the package substrate by third sockets; second photonic engines attached to the second surface of the package substrate by third sockets; a cooling component over the first photonic engines and over the second photonic engines, the cooling component secured against the first photonic engines and the second photonic engines by a first retention frame and a second retention frame; a second package substrate attached to the second surface of the first package substrate; and a die attached to the second package substrate, wherein the die is communicatively coupled to individual ones of the first photonic engines and individual ones of the second photonic engines through the first package substrate and the second package substrate.

Example 23: the electronic system of Example 22, wherein the die is a switching die.

Example 24: the electronic system of Example 23, wherein the electronic system is a switch blade.

Example 25: the electronic system of Example 24, wherein the electronic system is a switch blade in a modular server system.

What is claimed is:

1. An electronic package, comprising:
   a first package substrate, the first package substrate having a first surface opposite a second surface, and having a first lateral side, a second lateral side, a third lateral side, and a fourth lateral side between the first surface and the second surface;
   a second package substrate coupled to the first surface of the first package substrate, the second package substrate within a footprint of the first package substrate;
   a die coupled to the second package substrate, the die within a footprint of the second package substrate;
   a first photonic engine on the first surface of the first package substrate and extending over the first lateral side of the first package substrate;
   a second photonic engine on the first surface of the first package substrate and extending over the second lateral side of the first package substrate;
   a third photonic engine on the first surface of the first package substrate and extending over the third lateral side of the first package substrate;
   a fourth photonic engine on the first surface of the first package substrate and extending over the fourth lateral side of the first package substrate; and
   an additional photonic engine on the second surface of the first package substrate.

2. The electronic package of claim 1, further comprising:
   a fifth photonic engine on the first surface of the first package substrate and extending over the first lateral side of the first package substrate; and a sixth photonic engine on the first surface of the first package substrate and extending over the third lateral side of the first package substrate.

3. The electronic package of claim 2, further comprising:
a seventh photonic engine on the first surface of the first package substrate and extending over the second lateral side of the first package substrate; and
an eighth photonic engine on the first surface of the first package substrate and extending over the fourth lateral side of the first package substrate.

4. The electronic package of claim 3, further comprising:
a ninth photonic engine and a tenth photonic engine on the second surface of the first package substrate and extending over the first lateral side of the first package substrate;
an eleventh photonic engine and a twelfth photonic engine on the second surface of the first package substrate and extending over the second lateral side of the first package substrate;
a thirteenth photonic engine and a fourteenth photonic engine on the second surface of the first package substrate and extending over the third lateral side of the first package substrate; and
a fifteenth photonic engine and the additional photonic engine on the second surface of the first package substrate and extending over the fourth lateral side of the first package substrate.

5. The electronic package of claim 1, wherein each of the photonic engines comprises one or more optical inputs/outputs.

6. The electronic package of claim 1, wherein each of the photonic engines is coupled to the first substrate by a corresponding socket.

7. The electronic package of claim 1, wherein each of the photonic engines is coupled to a corresponding integrated heat spreader.

8. The electronic package of claim 1, wherein the die is a switch die.

9. A system, comprising:
a board; and
an electronic package coupled to the board, the electronic package comprising:
  a first package substrate, the first package substrate having a first surface opposite a second surface, and having a first lateral side, a second lateral side, a third lateral side, and a fourth lateral side between the first surface and the second surface;
  a second package substrate coupled to the first surface of the first package substrate, the second package substrate within a footprint of the first package substrate;
  a die coupled to the second package substrate, the die within a footprint of the second package substrate;
  a first photonic engine on the first surface of the first package substrate and extending over the first lateral side of the first package substrate;
  a second photonic engine on the first surface of the first package substrate and extending over the second lateral side of the first package substrate;
  a third photonic engine on the first surface of the first package substrate and extending over the third lateral side of the first package substrate;
  a fourth photonic engine on the first surface of the first package substrate and extending over the fourth lateral side of the first package substrate; and
  an additional photonic engine on the second surface of the first package substrate.

10. The system of claim 9, further comprising:
an Ethernet channel coupled to the board.

11. The system of claim 9, further comprising:
an power supply coupled to the board.

12. The system of claim 9, further comprising:
a cooling fan coupled to the board.

13. The system of claim 9, wherein the electronic package further comprises:
a fifth photonic engine on the first surface of the first package substrate and extending over the first lateral side of the first package substrate; and
a sixth photonic engine on the first surface of the first package substrate and extending over the third lateral side of the first package substrate.

14. The system of claim 13, wherein the electronic package further comprises:
a seventh photonic engine on the first surface of the first package substrate and extending over the second lateral side of the first package substrate; and
an eighth photonic engine on the first surface of the first package substrate and extending over the fourth lateral side of the first package substrate.

15. The system of claim 14, wherein the electronic package further comprises:
a ninth photonic engine and a tenth photonic engine on the second surface of the first package substrate and extending over the first lateral side of the first package substrate;
an eleventh photonic engine and a twelfth photonic engine on the second surface of the first package substrate and extending over the second lateral side of the first package substrate;
a thirteenth photonic engine and a fourteenth photonic engine on the second surface of the first package substrate and extending over the third lateral side of the first package substrate; and
a fifteenth photonic engine and the additional photonic engine on the second surface of the first package substrate and extending over the fourth lateral side of the first package substrate.

16. The system of claim 9, wherein each of the photonic engines of the electronic package comprises one or more optical inputs/outputs.

17. The system of claim 9, wherein each of the photonic engines of the electronic package is coupled to the first substrate by a corresponding socket.

18. The system of claim 9, wherein each of the photonic engines of the electronic package is coupled to a corresponding integrated heat spreader.

19. The system of claim 9, wherein the die of the electronic package is a switch die.

* * * * *